(12) United States Patent
Park et al.

(10) Patent No.: US 8,618,730 B2
(45) Date of Patent: Dec. 31, 2013

(54) ORGANIC LIGHT EMITTING DIODE DISPLAY

(75) Inventors: Hye-Jung Park, Yongin (KR); Soon-Ryong Park, Yongin (KR); Woo-Suk Jung, Yongin (KR); Sun-Hwa Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 13/429,299

(22) Filed: Mar. 23, 2012

(65) Prior Publication Data

US 2013/0063022 A1    Mar. 14, 2013

(30) Foreign Application Priority Data

Sep. 9, 2011 (KR) .................. 10-2011-0092152

(51) Int. Cl.
 *H01J 1/62* (2006.01)
 *H01J 63/04* (2006.01)
(52) U.S. Cl.
 USPC ............ 313/504; 313/498; 313/506; 313/512
(58) Field of Classification Search
 USPC ................................. 313/498–512
 See application file for complete search history.

(56) References Cited

U.S. PATENT DOCUMENTS

| 2007/0132378 A1* | 6/2007 | Cok et al. ............... 313/506 |
| 2007/0290607 A1* | 12/2007 | Okada et al. .......... 313/504 |
| 2008/0180025 A1* | 7/2008 | Baba et al. ............ 313/504 |
| 2009/0051274 A1* | 2/2009 | Hayashi ................. 313/504 |
| 2010/0060149 A1* | 3/2010 | Song et al. ............ 313/504 |
| 2011/0025199 A1* | 2/2011 | Park et al. ............. 313/504 |
| 2011/0234088 A1* | 9/2011 | Abe ....................... 313/504 |

FOREIGN PATENT DOCUMENTS

| JP | 2010-153284 | 7/2010 |
| KR | 10-2006-0062102 A | 6/2006 |
| KR | 10-2008-0094989 A | 10/2008 |
| KR | 10-2010-0030865 A | 3/2010 |
| KR | 10-2010-0079987 A | 7/2010 |
| KR | 10-2010-0080078 A | 7/2010 |

* cited by examiner

*Primary Examiner* — Anh T. Mai
*Assistant Examiner* — Kevin Quarterman
(74) *Attorney, Agent, or Firm* — Christie, Parker & Hale, LLP (57) ABSTRACT

An organic light emitting diode (OLED) display includes: a substrate; an organic light emitting element on the substrate; a thin film encapsulation layer covering the organic light emitting element; and a viewing angle compensation layer on the thin film encapsulation layer, wherein the viewing angle compensation layer corresponding to a pixel of the organic light emitting element has a plurality of sub-viewing angle compensation members. Accordingly, in the organic light emitting diode (OLED) display according to an exemplary embodiment, the viewing angle compensation layer is disposed on the thin film encapsulation layer such that optical characteristic changes such as the luminance change and the color change according to the viewing angle may be minimized or reduced.

15 Claims, 13 Drawing Sheets

ORGANIC LIGHT EMITTING DIODE DISPLAY

CROSS-REFERENCE TO RELATED APPLICATION

This application claims priority to and the benefit of Korean Patent Application No. 10-2011-0092152 filed in the Korean Intellectual Property Office on Sep. 9, 2011, the entire content of which is incorporated herein by reference.

BACKGROUND

1. Field

Aspects of embodiments according to the present invention relate generally to an organic light emitting diode (OLED) display.

2. Description of Related Art

An organic light emitting diode (OLED) display includes organic light emitting elements each formed of a hole injection electrode, an organic emission layer, and an electron injection electrode. With the OLED display, electrons and holes are combined with each other in the organic emission layer to thereby generate excitons. When the excitons shift from the excited state to the ground state, energy is released so as to emit light, and images are displayed on the basis of the emitted light.

An OLED display is a flat panel display that can be made lightweight and thin because the OLED display has a self-luminous characteristic and requires no separate light source. Particularly, the OLED display exhibits desirable quality characteristics such as low power consumption, high luminance, and high response speed. Therefore, the OLED display is regarded as a next-generation display device.

The organic light emitting element may deteriorate due to internal and external factors. Of the internal factors, the organic emissive layer deteriorates because of oxygen from indium tin oxide (ITO) that is used as the electrode material, or under an interfacial reaction between organic layer components of the organic emissive layer. The external factors include external moisture and oxygen, and ultraviolet rays. In particular, as the external oxygen and moisture seriously influence the life span of the organic light emitting diode, it is very important to package the organic light emitting diode such that it is sealed from the outside in a vacuum-tight manner.

A thin film encapsulation (TFE) technique may be applied in packaging the organic light emitting diode, which is well known to those skilled in the art. With the thin film encapsulation technique, one or more of inorganic and organic layers are alternately deposited on the organic light emitting elements formed at the display area of the substrate, thereby covering the display area with a thin film encapsulation layer. In an OLED display with such a thin film encapsulation layer, if the substrate is formed with a flexible film, it can be bent easily, and a slim structure may be formed.

However, the flexible organic light emitting diode (OLED) display has a structure in which a plurality of inorganic layers and a plurality of organic layers are alternately deposited such that an optical characteristic in terms of a viewing angle is changed. To compensate for the change of the viewing angle, a viewing angle compensation film including a plurality of phase difference films, a prism sheet, or beads may be used. However, the viewing angle compensation method uses a plurality of phase difference films such that the thickness of the organic light emitting diode (OLED) display is increased, and the manufacturing process is complicated such that cost is increased.

The above information disclosed in this Background section is only for enhancement of understanding of the background of the present invention, and therefore it may contain information that does not form the prior art that is already known in this country to a person of ordinary skill in the art.

SUMMARY

Embodiments of the present invention are directed toward an organic light emitting diode (OLED) display that can minimize or reduce a change of an optical characteristic according to a viewing angle.

An organic light emitting diode (OLED) display according to an exemplary embodiment includes: a substrate; an organic light emitting element on the substrate; a thin film encapsulation layer covering the organic light emitting element; and a viewing angle compensation layer on the thin film encapsulation layer, wherein the viewing angle compensation layer corresponding to a pixel of the organic light emitting element includes a plurality of sub-viewing angle compensation members.

A planar shape of the sub-viewing angle compensation member may have a plurality of concentric circular shapes.

The sub-viewing angle compensation member may include a plurality of compensation tubes concentrically arranged to have a same concentric circle center and different radii.

Neighboring ones of the compensation tubes may be separated from each other.

Among the plurality of compensation tubes, the width of the compensation tube may decrease as the radius of the compensation tube increases.

The plurality of compensation tubes may have a same height.

A separation distance of neighboring ones of the compensation tubes may increase as the radii of the neighboring compensation tubes increase.

Among the plurality of compensation tubes, the width of the compensation tubes may increase as the radius of the compensation tube increases.

An external circumferential surface of each of the compensation tubes may have a plurality of circular steps.

A step width of the plurality of circular steps may decrease toward the concentric circle center.

The sub-viewing angle compensation member may include a plurality of circular steps concentrically arranged to have a same concentric circle center.

A step width of the plurality of circular steps may decrease toward the concentric circle center.

Accordingly, in the organic light emitting diode (OLED) display according to an exemplary embodiment, the viewing angle compensation layer is disposed on thin film encapsulation layer such that the optical characteristic change such as the luminance change and the color change according to the viewing angle may be reduced or minimized.

Also, the viewing angle compensation layer of the simple process and the low cost may be formed such that the manufacturing cost may be reduced.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
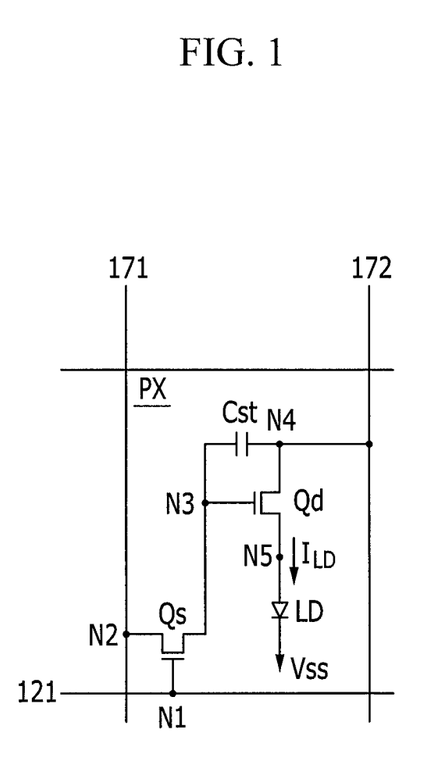
FIG. 1 is an equivalent circuit schematic drawing of one pixel of an organic light emitting diode (OLED) display according to a first exemplary embodiment.

FIG. 1 is an equivalent circuit schematic drawing of one pixel of an organic light emitting diode (OLED) display according to a first exemplary embodiment.

Referring to FIG. 1, an organic light emitting device according to the present exemplary embodiment includes a plurality of signal lines 121, 171, and 172, and a pixel PX connected thereto. The pixel PX may be one of a red pixel R, a green pixel G, and a blue pixel B.

The signal lines include a plurality of scan signal lines 121 for transmitting gate signals (or scanning signals), a plurality of data lines 171 for transmitting data signals, and a plurality of driving voltage lines 172 for transmitting a driving voltage. Only one scan signal line 121, one data line 171, and one driving voltage line 172 are shown in FIG. 1. The scan lines 121 extend substantially in a row direction and substantially parallel to each other, and the data lines 171 extend substantially in a column direction and substantially parallel to each other. The driving voltage lines 172 extend substantially in the column direction and substantially parallel to each other. However, the driving voltage lines 172 may extend in the row direction or the column direction, and may form a mesh shape.

The pixel PX includes a switching transistor Qs, a driving transistor Qd, a capacitor Cst, and an organic light emitting element LD.

The switching transistor Qs has a control terminal connected to one of the scan lines 121 at a node N1, an input terminal connected to one of the data lines 171 at a node N2, and an output terminal connected to the driving transistor Qd at a node N3. The switching transistor Qs transmits the data signals applied to the data line 171 to the driving transistor Qd in response to a gate signal applied to the scan line 121.

The driving transistor Qd has a control terminal connected to the switching transistor Qs at the node N3, an input terminal connected to the driving voltage line 172 at a node N4, and an output terminal connected to the organic light emitting element LD at a node N5. The driving transistor Qd drives an output current $I_{LD}$ having a magnitude depending on the voltage between the control terminal at the node N3 and the output terminal at the node N5 thereof.

The capacitor Cst is connected between the control terminal at the node N3 and the input terminal at the node N4 of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage source Vss. The organic light emitting element LD emits light having an intensity depending on the output current $I_{LD}$ of the driving transistor Qd, thereby displaying images. The organic light emitting element LD may include an organic material for emitting at least one of three primary colors of red, green, and blue, and the organic light emitting device displays desired images by a spatial sum of the primary colors.

The switching transistor Qs and the driving transistor Qd may be N-channel field effect transistors (FETs). In other embodiments, at least one of the switching transistor Qs or the driving transistor Qd may be a P-channel FET. In addition, the connections among the transistors Qs and Qd, the capacitor Cst, and the organic light emitting diode LD may be modified.

A structure of the organic light emitting diode (OLED) display according to the first exemplary embodiment will be described with reference to FIG. 2 and FIG. 3 as well as FIG. 1.

Figure 2:
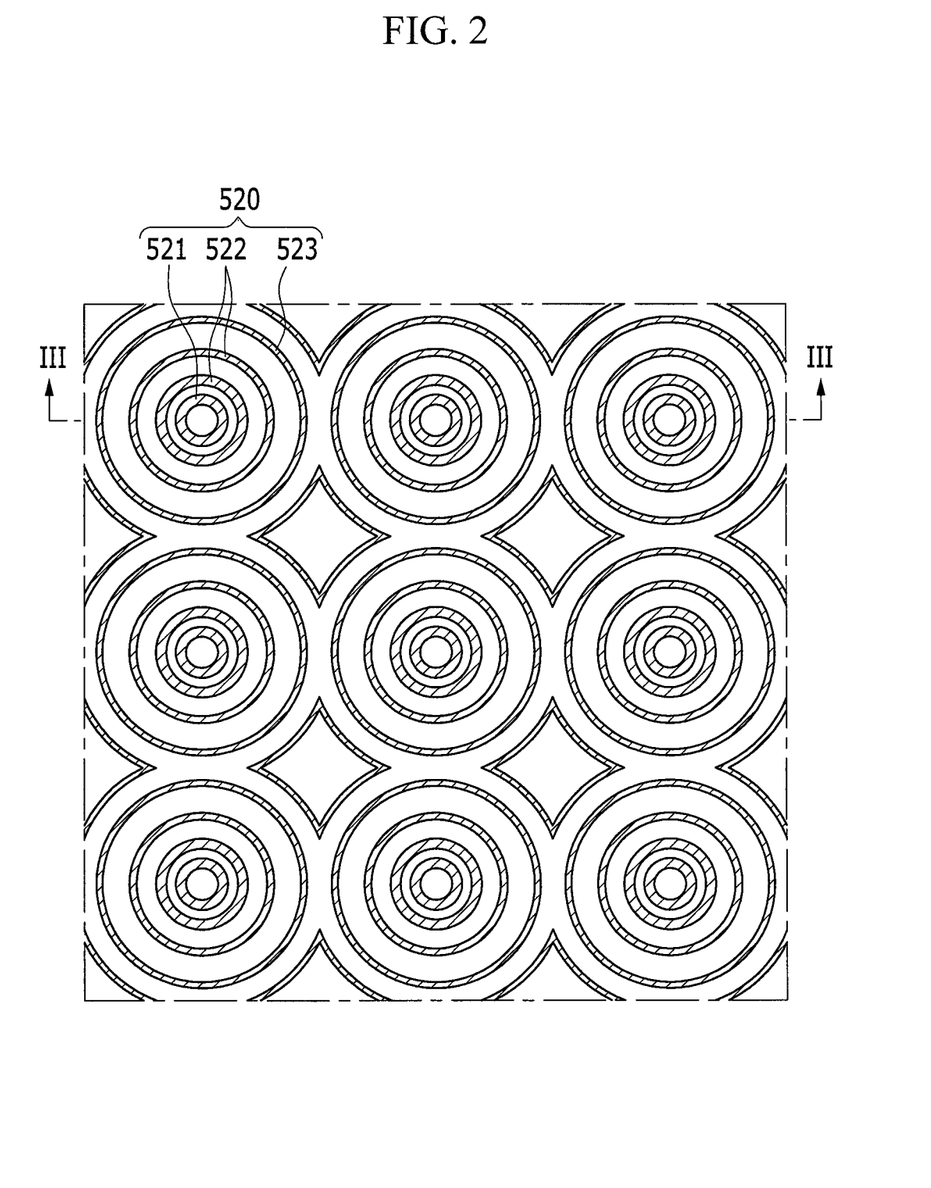
FIG. 2 is a top plan view of one pixel of an organic light emitting diode (OLED) display according to the first exemplary embodiment.
Figure 3:
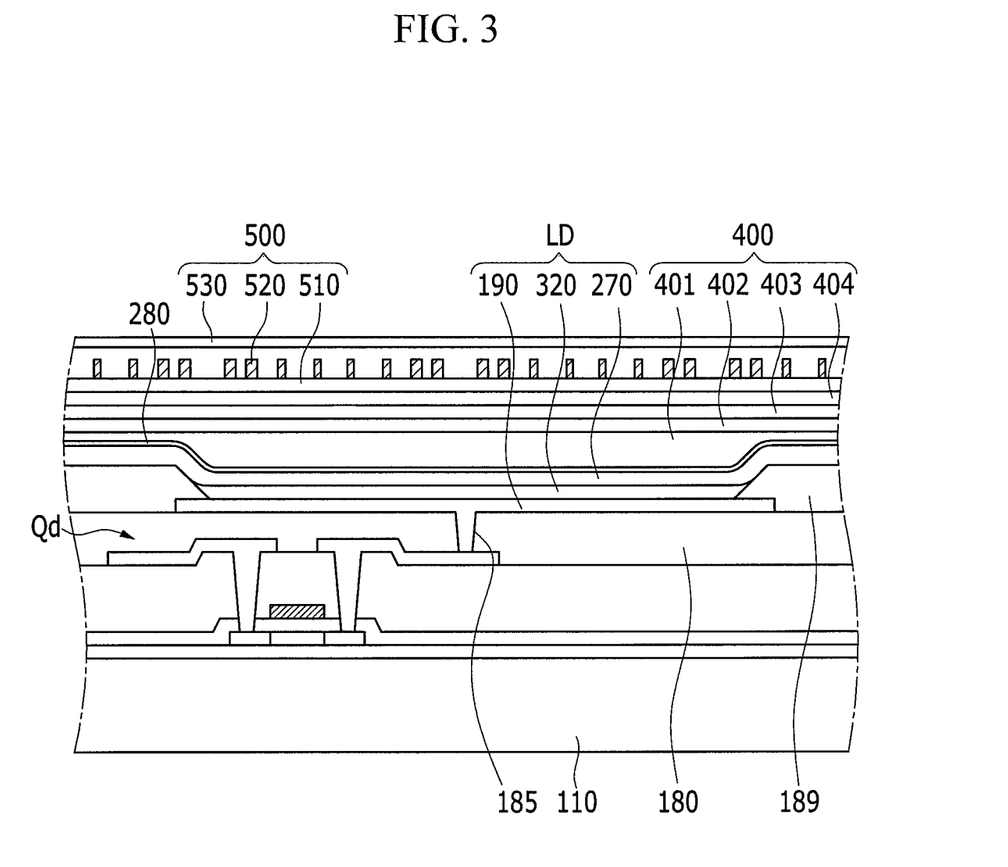
FIG. 3 is a cross-sectional view of the organic light emitting diode (OLED) display shown in FIG. 2.

FIG. 2 is a top plan view of one pixel of an organic light emitting diode (OLED) display according to the first exemplary embodiment, and FIG. 3 is a cross-sectional view of the organic light emitting diode (OLED) display shown in FIG. 2.

As shown in FIG. 2 and FIG. 3, a driving transistor Qd is formed on an insulation substrate 110 made of transparent glass or plastic. Also, a plurality of signal lines (not shown) and a plurality of switching transistors (not shown) may be further formed on the insulation substrate 110.

A passivation layer 180 made of an inorganic material or an organic material is formed on the driving transistors Qd. When the passivation layer 180 is made of the organic material, the surface thereof may be flat. The passivation layer 180 has a contact hole 185 exposing a portion of the driving transistor Qd. A pixel electrode 190 is formed on the passivation layer 180. The pixel electrode 190 may include a reflection electrode and a transparent electrode formed thereon. The reflection electrode may be made of a metal having high reflectance such as silver (Ag) or aluminum (Al), or alloys thereof, and the transparent electrode may be made of a transparent conductive oxide such as indium tin oxide (ITO) or indium zinc oxide (IZO).

A pixel defining layer 189 covering the edge circumference (or periphery) of the pixel electrode 191 is formed on the passivation layer 180.

An organic emission layer 320 is formed on the pixel electrode 190, and a common electrode 270 is formed on the organic emission layer 320 and the pixel defining layer 189.

The organic emission layer 320 may further include an emission layer (not shown) where light is substantially emitted, and organic layers (not shown) for efficient transmission of carriers of holes or electrons to the emission layer. The organic layers may include a hole injection layer (HIL) and a hole transport layer (HTL) disposed between the pixel electrode 190 and the emission layer, and a hole injection layer (HIL) and a hole transport layer (HTL) disposed between the common electrode 270 and the emission layer.

An overcover 280 that covers and protects the common electrode 270 and is made of an organic layer may be formed on the common electrode 270.

A thin film encapsulation layer 400 is formed on the overcover 280. The thin film encapsulation layer 400 seals and protects the organic light emitting element LD and the driving circuit that are disposed on the substrate 110 against the external environment.

The thin film encapsulation layer 400 includes organic encapsulation layers 401 and 403 and inorganic encapsulation layers 402 and 404. The organic encapsulation layers 401 and 403 and the inorganic encapsulation layers 402 and 404 are alternately layered. In FIG. 3, for example, two organic encapsulation layers 401 and 403 and two inorganic encapsulation layers 402 and 404 are alternately deposited one by one to form the thin film encapsulation layer 400. However, the present invention is not limited thereto.

A viewing angle compensation layer 500 is formed on the thin film encapsulation layer 400.

The viewing angle compensation layer 500 includes a supporting layer 510 formed on the thin film encapsulation layer 400, a plurality of sub-viewing angle compensation members 520 formed on the supporting layer 510, and an external protective layer 530 covering and protecting the plurality of sub-viewing angle compensation members 520 from the outside.

The supporting layer 510 contacts the thin film encapsulation layer 400 and attaches the viewing angle compensation layer 500 to the thin film encapsulation layer 400.

The plurality of sub-viewing angle compensation members 520 are placed in one pixel and are adjacent to each other. The same number of sub-viewing angle compensation members 520 are disposed in the row direction and the column direction such that the light emitted in right, left, up, and down directions are compensated, thereby improving the viewing angle. FIG. 2 shows a state in which three columns and three rows of the sub-viewing angle compensation members 520 are disposed, but the present invention is not limited thereto and the sub-viewing angle compensation members 520 may be disposed in various arrangements. The sub-viewing angle compensation member 520 is formed with a micro-Fresnel lens to improve the viewing angle.

When the sub-viewing angle compensation member 520 is not used in the pixel, a front image and a side image are different according to a light path. However, when the sub-viewing angle compensation member 520 is present, the front image and the side image are substantially the same such that the viewing angle is improved.

Figure 4:
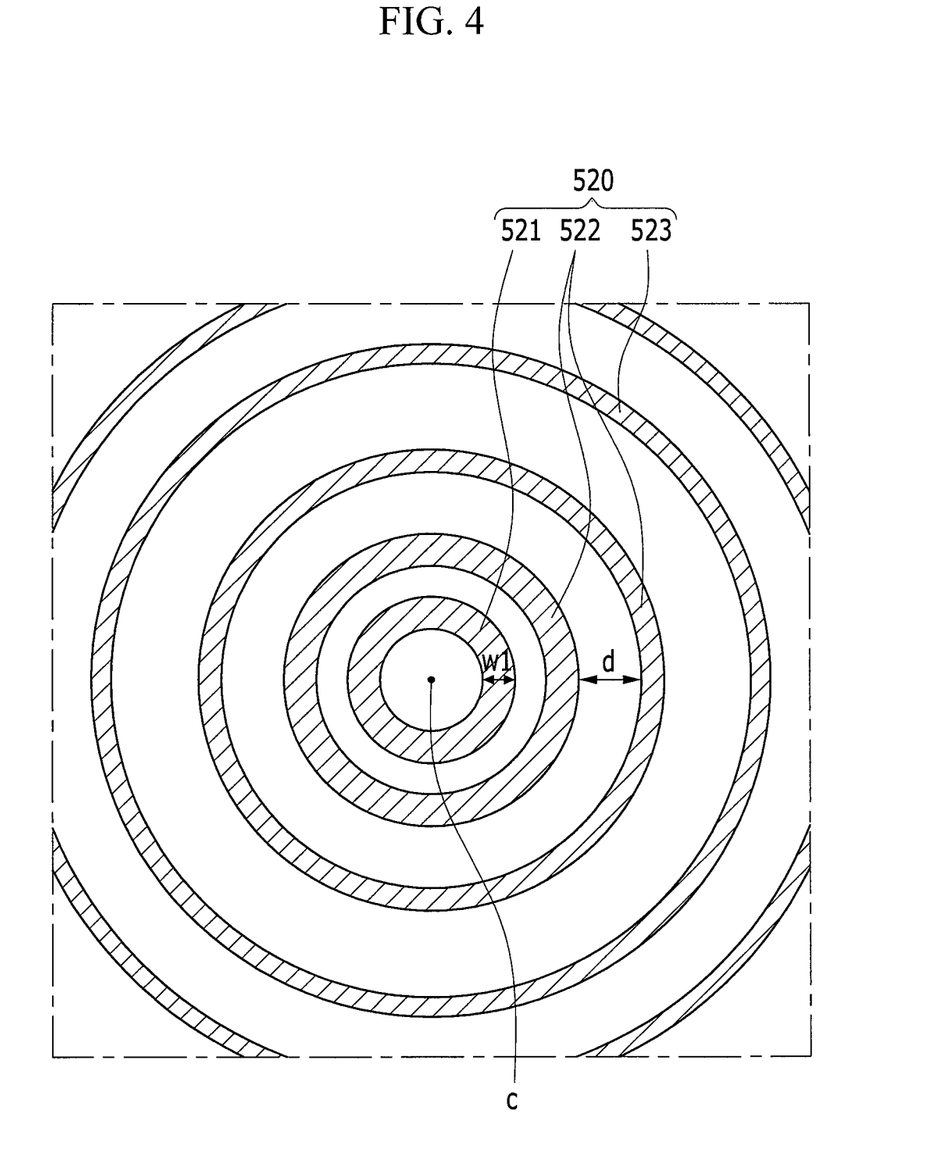
FIG. 4 is an enlarged top plan view of one sub-viewing angle compensation member of an organic light emitting diode (OLED) display according to the first exemplary embodiment.
Figure 5:
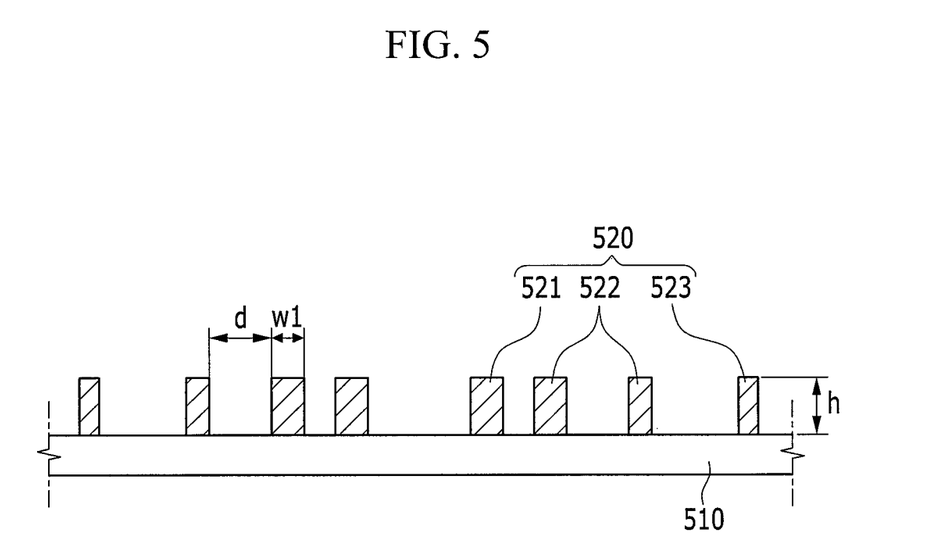
FIG. 5 is a cross-sectional view of FIG. 4.

FIG. 4 is an enlarged top plan view of one sub-viewing angle compensation member of an organic light emitting diode (OLED) display according to the first exemplary embodiment, and FIG. 5 is a cross-sectional view of FIG. 4.

As shown in FIG. 4 and FIG. 5, a plane shape of one sub-viewing angle compensation member 520 includes a plurality of concentric circular shapes. That is, one sub-viewing angle compensation member 520 includes a plurality of compensation tubes 521, 522, and 523 having the same concentric circle center C and different radii. The adjacent compensation tubes 521, 522, and 523 are separated by a set or predetermined separation distance d. The compensation tubes 521, 522, and 523 are disposed with reference to the concentric circle center C, and include a center compensation tube 521 having the smallest radius, an intermediate compensation tube 522, and an outer compensation tube 523 having the largest radius.

The width w1 of the compensation tubes 521, 522, and 523 decreases from the center compensation tube 521 having the smallest radius to the outer compensation tube 523 having the largest radius. Further, the separation distance d between the adjacent compensation tubes increases from the center compensation tube 521 to the outer compensation tube 523, and a height h of the plurality of compensation tubes 521, 522, and 523 is the same. The plurality of compensation tubes 521, 522, and 523 may be formed by patterning a material such as an oxide layer ($SiO_2$), a polyimide (PI), or an acryl by using a photolithography process.

As described above, obliquely incident light is aligned in parallel by the viewing angle compensation layer 500 having the micro-Fresnel lens formed on the thin film encapsulation layer 400 such that the same images as seen at the front may be recognized at the side, thereby improving the viewing angle.

In the first exemplary embodiment, the sub-viewing angle compensation member is formed with the micro-Fresnel lens. However, the sub-viewing angle compensation member may be formed of a plurality of circular steps having the same concentric circle center.

Figure 6:
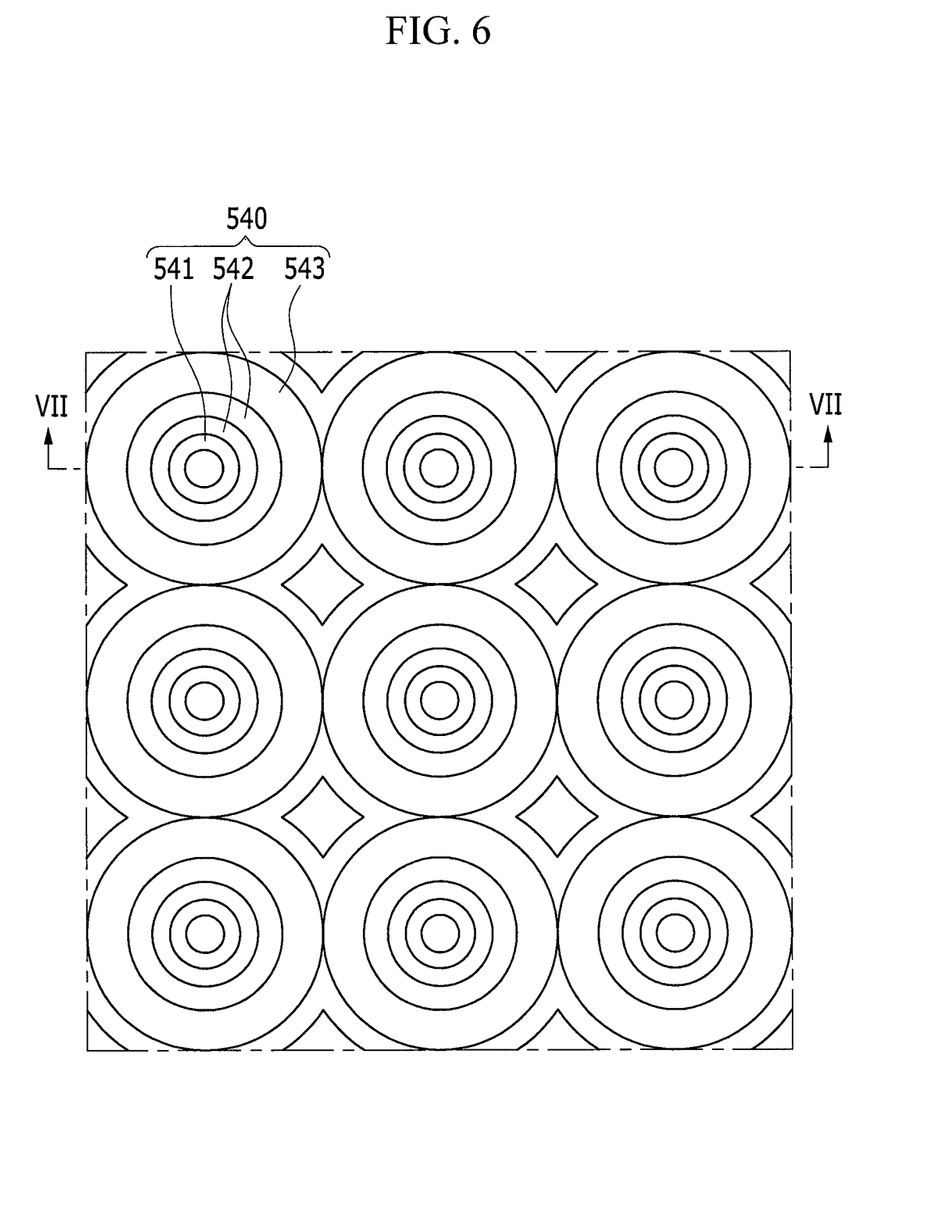
FIG. 6 is a top plan view of one pixel of an organic light emitting diode (OLED) display according to a second exemplary embodiment.
Figure 7:
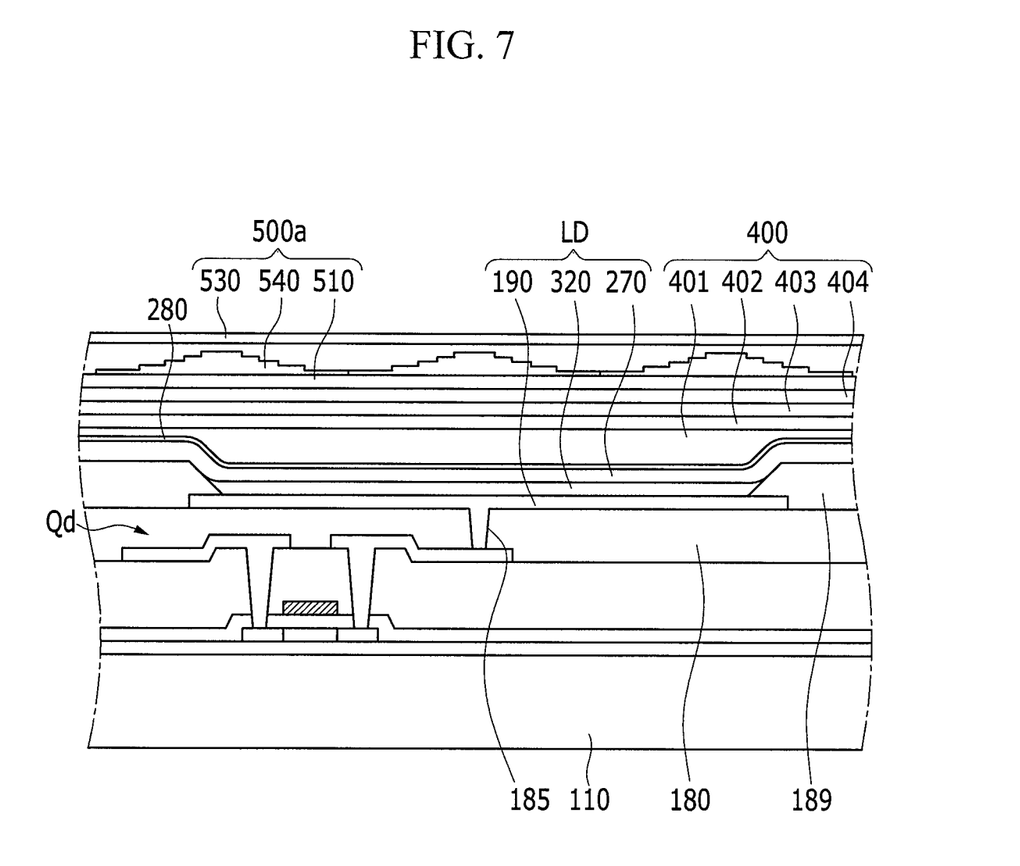
FIG. 7 is a cross-sectional view of the organic light emitting diode (OLED) display shown in FIG. 6.
Figure 8:
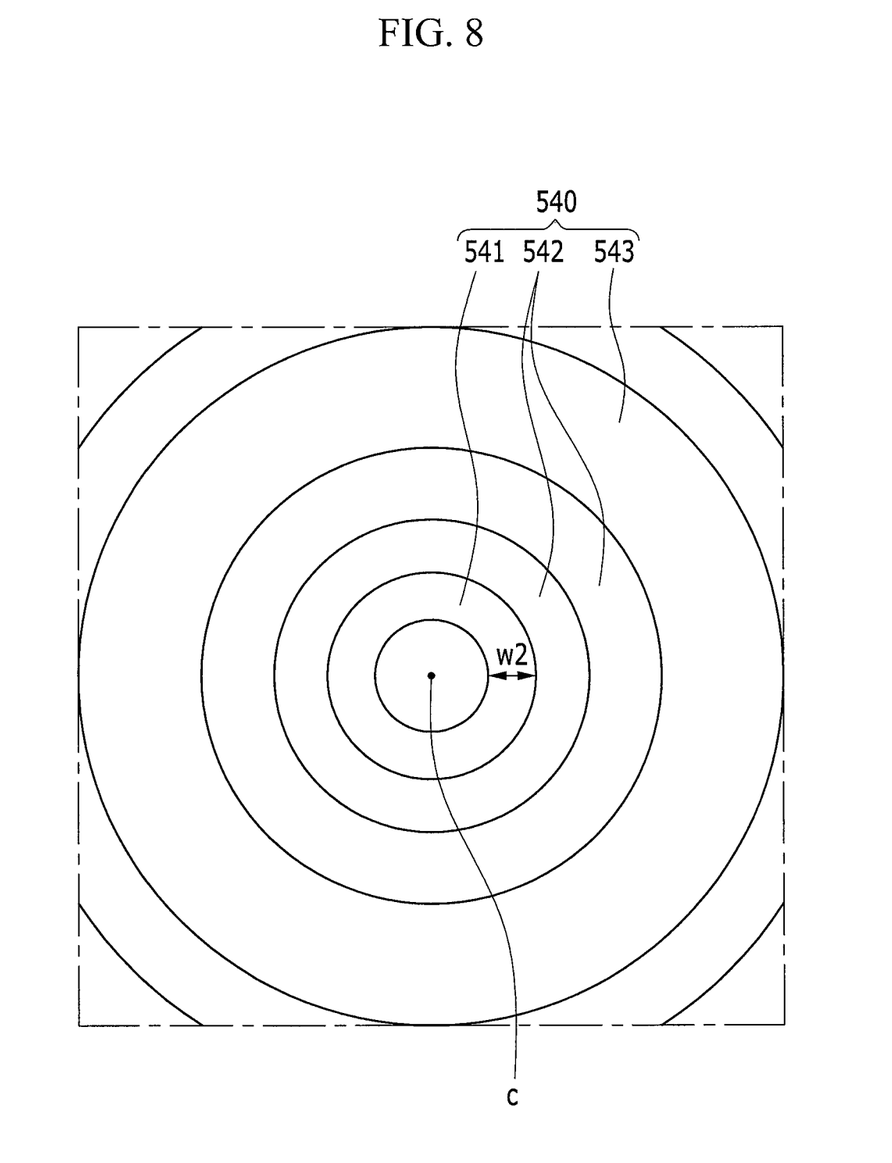
FIG. 8 is an enlarged top plan view of one sub-viewing angle compensation member of an organic light emitting diode (OLED) display according to the second exemplary embodiment.
Figure 9:
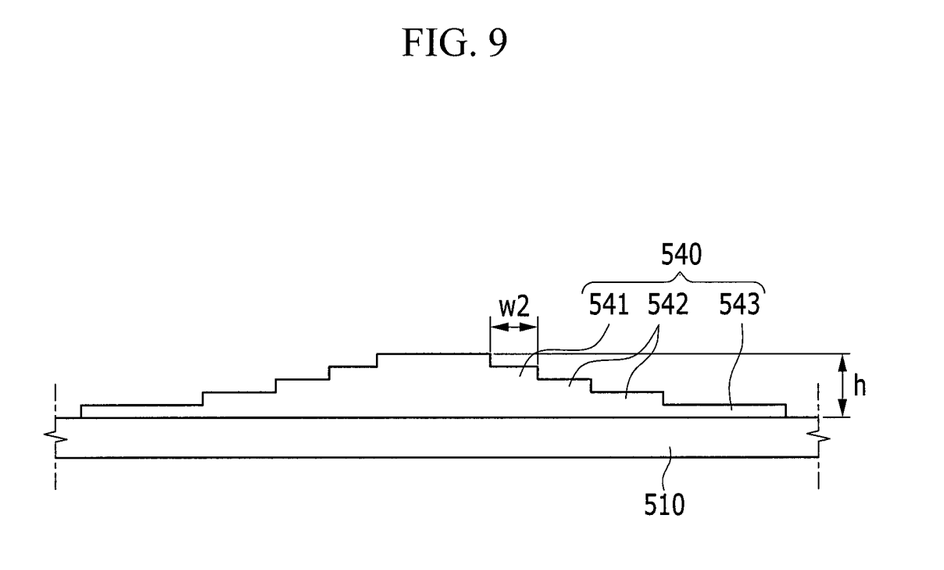
FIG. 9 is a cross-sectional view of FIG. 8.

FIG. 6 is a top plan view of one pixel of an organic light emitting diode (OLED) display according to a second exemplary embodiment, and FIG. 7 is a cross-sectional view of the organic light emitting diode (OLED) display shown in FIG. 6. FIG. 8 is an enlarged top plan view of one sub-viewing angle compensation member of an organic light emitting diode (OLED) display according to the second exemplary embodiment, and FIG. 9 is a cross-sectional view of FIG. 8.

The second exemplary embodiment shown in FIG. 6 through FIG. 9 is substantially equivalent to the first exemplary embodiment shown in FIG. 2 through FIG. 5 except for a structure of the sub-viewing angle compensation member.

As shown in FIG. 6 through FIG. 9, a viewing angle compensation layer 500a is formed on the thin film encapsulation layer 400. The viewing angle compensation layer 500a includes a supporting layer 510 formed on the thin film encapsulation layer 400, a plurality of sub-viewing angle compensation members 540 formed on the supporting layer 510, and an external protective layer 530 covering and protecting the plurality of sub-viewing angle compensation members 540 from the outside. A plurality of sub-viewing angle compensation members 540 are disposed in one pixel and are adjacent to each other. The same number of sub-viewing angle compensation members 540 are disposed in the row direction and the column direction. One sub-viewing angle compensation member 540 includes a plurality of circular steps 541, 542, and 543 having the same concentric circle center C.

The plurality of circular steps 541, 542, and 543 are disposed with reference to the concentric circle center C; and include a center circular step 541 closest to the concentric circle center C, an intermediate circular step 542, and an outer circular step 543. The step width w2 of the plurality of circular steps 541, 542, and 543 decreases toward the concentric circle center C.

By controlling the height h of the sub-viewing angle compensation members 540 and the step width w2 of the circular steps, optical characteristic changes such as the luminance change and the color change according to the viewing angle may be minimized or reduced. The height h of the sub-viewing angle compensation members 540 according to a wavelength λ of passing light, a refractive index $n_1$ of the circular steps, the number m of the circular steps, and the number L of layers of the circular steps are defined by Equation 1 below.

$$h(n) = \frac{\lambda}{|n_2 - n_1|}\left(\text{int}\left[\frac{m-1}{L}\right] - \frac{m}{L} + 1\right)$$

Equation 1

Here, "int" denotes integration, and $n_2$ denotes a refractive index of an outer medium of the sub-viewing angle compensation member 540.

For example, in the sub-viewing angle compensation member 540 shown in FIG. 9, the number m of the circular steps is 9, and the number L of layers of the circular steps is 4. The refractive index $n_2$ of air is 1, the refractive index $n_1$ of the circular steps is 1.54, and the contribution of the green (G) for the luminance is large among red (R), green (G), and blue (B) such that the height h of the sub-viewing angle compensation member 540 for the green light of which the wavelength is 550 nm is about 1.02 μm.

The number m of circular steps may be controlled according to the size of the pixel such that the height h of the sub-viewing angle compensation member 540 may be optimized to be not too high.

The plurality of circular steps 541, 542, and 543 may be formed by using a half tone mask or a gray mask.

By forming the viewing angle compensation layer 500 including a plurality of circular steps 541, 542, and 543 having the same concentric circle center C on the thin film encapsulation layer 400, all light is aligned in parallel such that the same image as that seen at the front may be recognized at the side, thereby improving the viewing angle.

Here, a circular step may be formed at the compensation layer, unlike the first exemplary embodiment.

Figure 10:
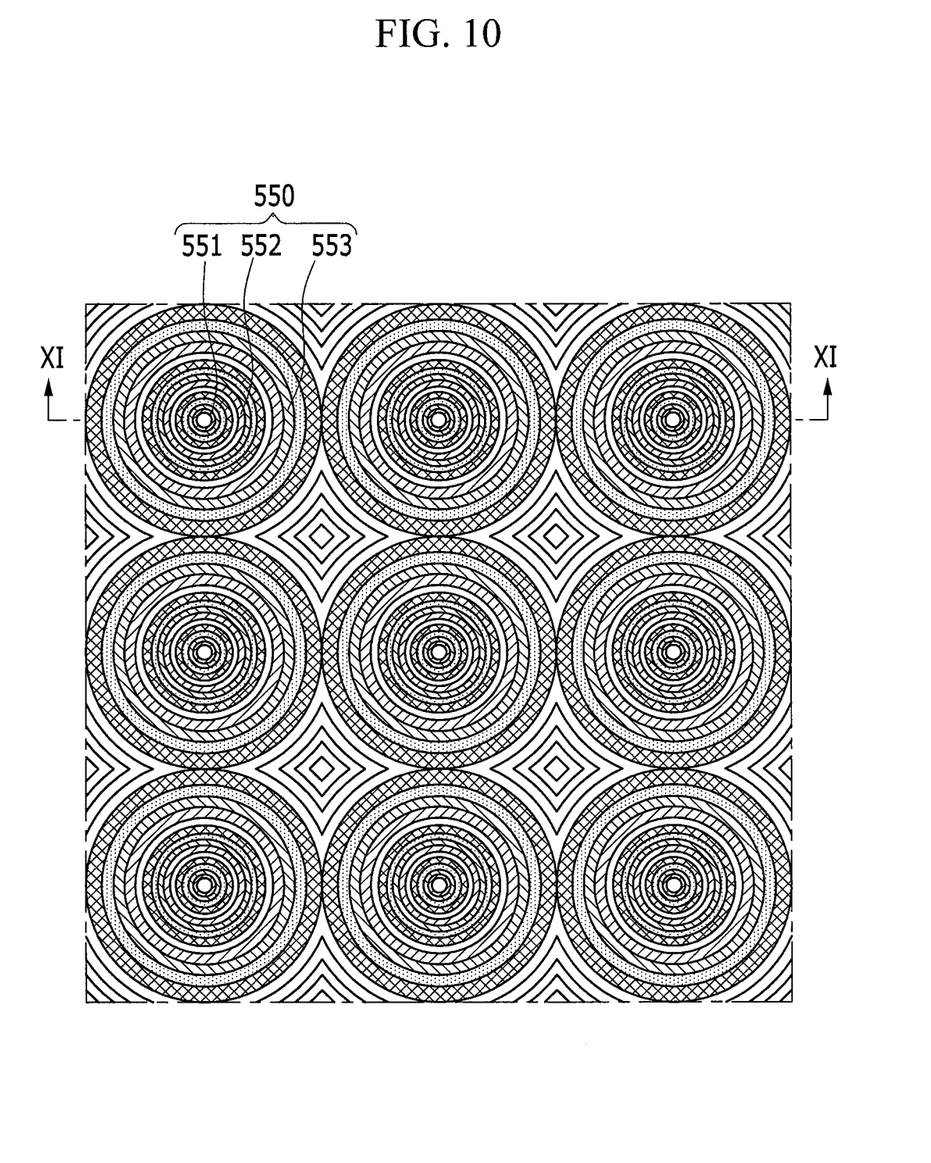
FIG. 10 is a top plan view of one pixel of an organic light emitting diode (OLED) display according to a third exemplary embodiment.
Figure 11:
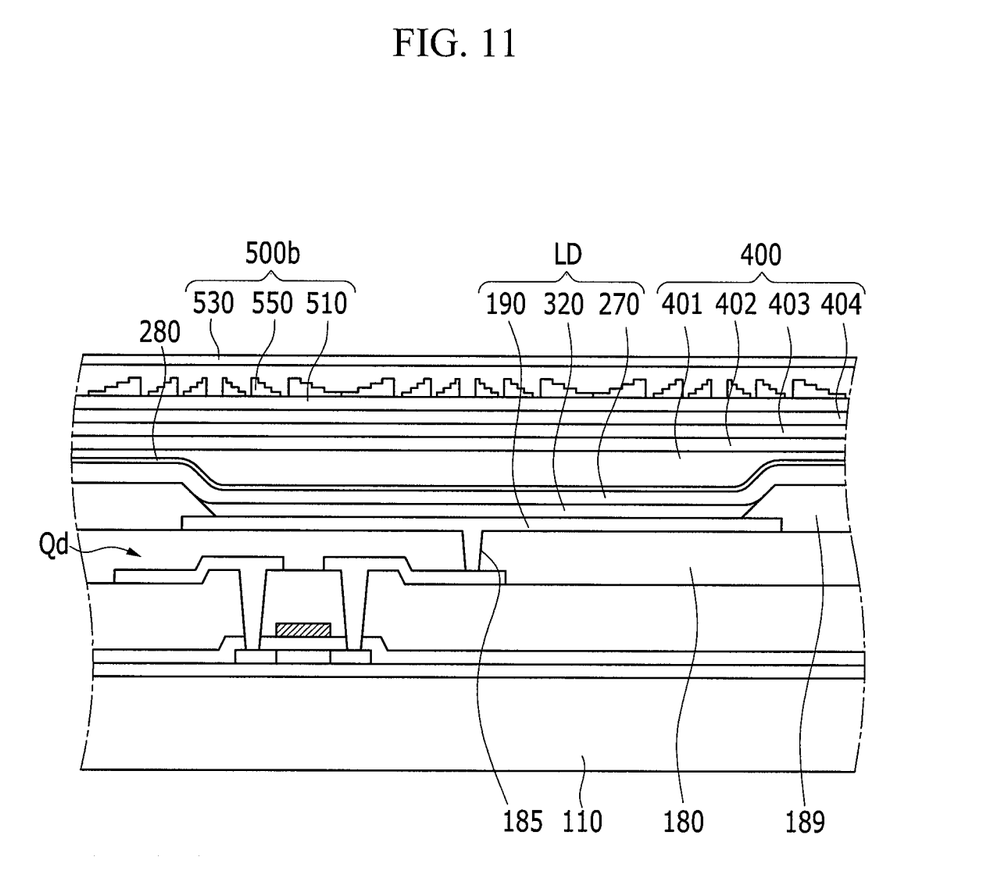
FIG. 11 is a cross-sectional view of the organic light emitting diode (OLED) display shown in FIG. 10.
Figure 12:
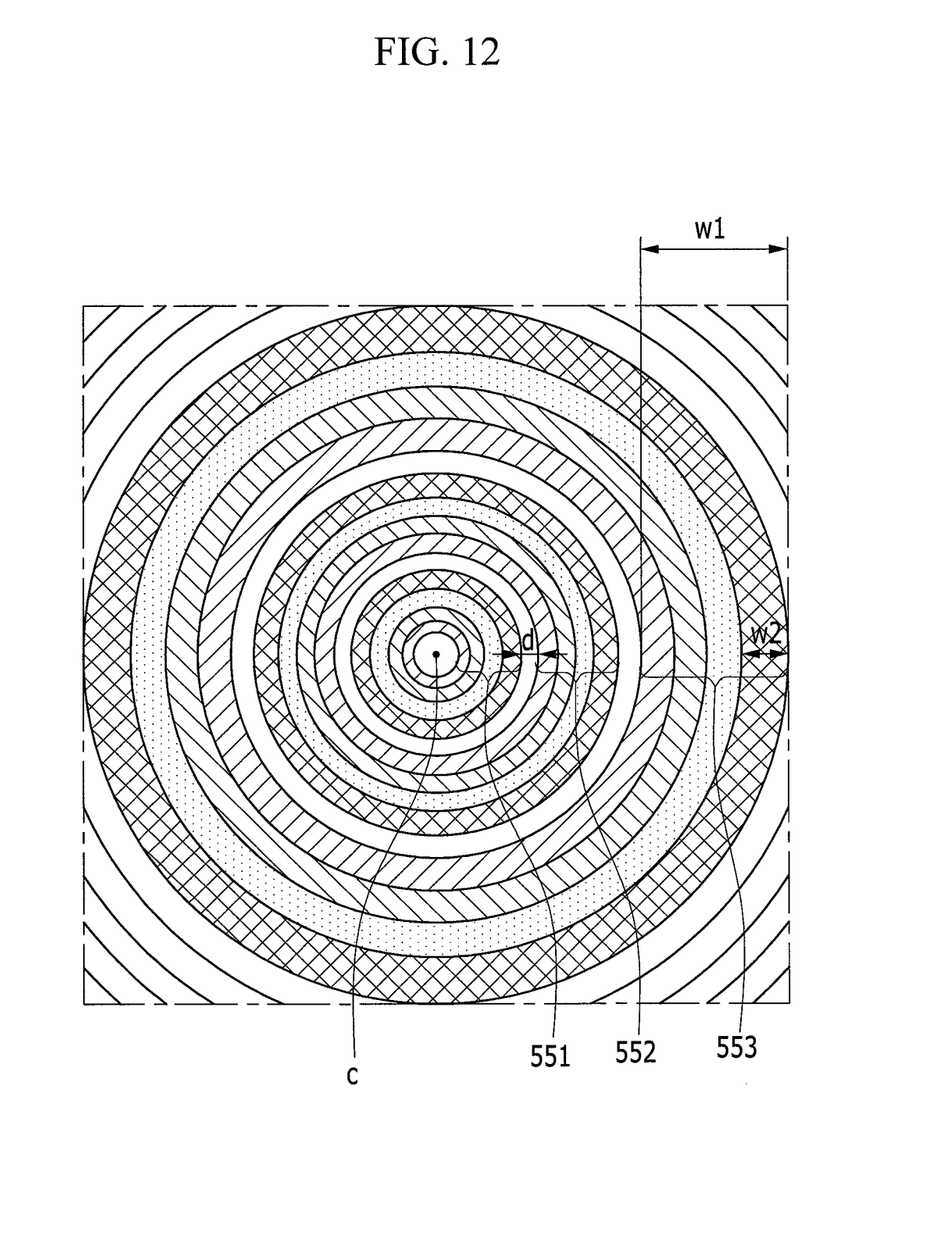
FIG. 12 is an enlarged top plan view of one sub-viewing angle compensation member of an organic light emitting diode (OLED) display according to the third exemplary embodiment.

FIG. 10 is a top plan view of one pixel of an organic light emitting diode (OLED) display according to a third exemplary embodiment, and FIG. 11 is a cross-sectional view of the organic light emitting diode (OLED) display shown in FIG. 10. FIG. 12 is an enlarged top plan view of one sub-viewing angle compensation member of an organic light emitting diode (OLED) display according to the third exemplary embodiment, and FIG. 13 is a cross-sectional view of FIG. 12.

The third exemplary embodiment of FIG. 10 through FIG. 13 is substantially equivalent to the first exemplary embodiment shown in FIG. 2 through FIG. 5 except for a structure of the sub-viewing angle compensation member such that repeated description is omitted.

As shown in FIG. 10 and FIG. 11, a viewing angle compensation layer 500b is formed on the thin film encapsulation layer 400. The viewing angle compensation layer 500b includes a supporting layer 510 formed on the thin film encapsulation layer 400, a plurality of sub-viewing angle compensation members 550 formed on the supporting layer 510, and an external protective layer 530 covering and protecting a plurality of sub-viewing angle compensation members 550. A plurality of sub-viewing angle compensation members 550 are disposed in one pixel and are adjacent to each other. The sub-viewing angle compensation members 550 are disposed with the same number in the row direction and the column direction.

Figure 13:
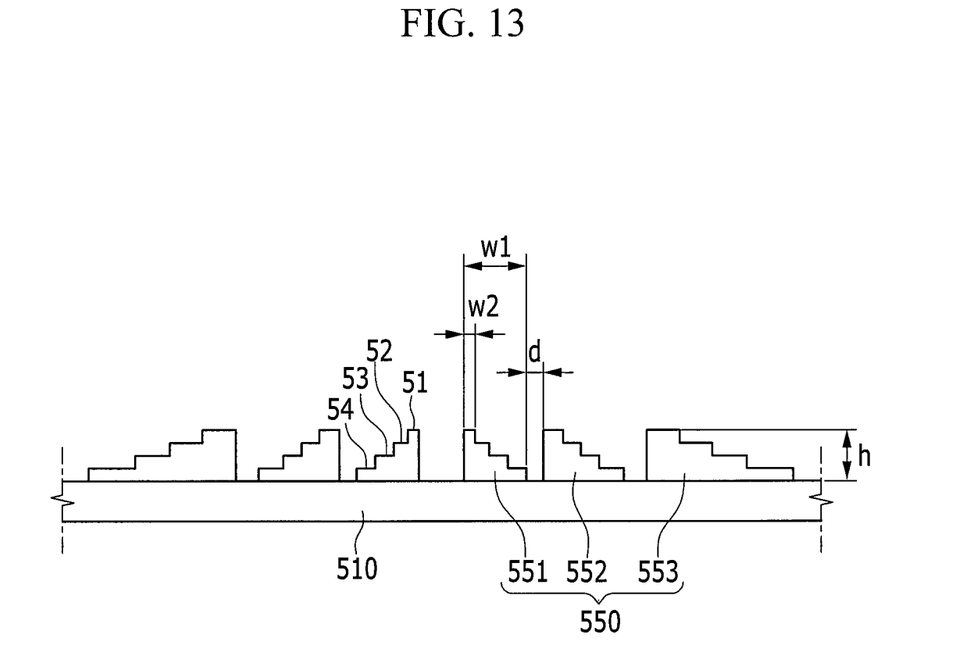
FIG. 13 is a cross-sectional view of FIG. 12.

As shown in FIG. 12 and FIG. 13, a planar shape of one sub-viewing angle compensation member 550 includes a plurality of concentric circular shapes. That is, one sub-viewing angle compensation member 550 includes a plurality of compensation tubes 551, 552, and 553 having the same concentric circle center C and different radii. The adjacent compensation tubes 551, 552, and 553 are separated by a set or predetermined separation distance d. The compensation tubes 551, 552, and 553 are disposed with reference to the concentric circle center C; and include a center compensation tube 551 having a smallest radius, an intermediate compensation tube 552, and an outer compensation tube 553 having the largest radius.

The width w1 of the compensation tubes 551, 552, and 553 increases from the center compensation tube 551 having the smallest radius to the outer compensation tube 553 having the largest radius. Further, the separation distance d between the adjacent compensation tubes increases from the center compensation tube 551 to the outer compensation tube 553, and the height h of the plurality of compensation tubes is the same.

Also, each of the compensation tubes 551, 552, and 553 includes a plurality of circular steps 51, 52, 53, and 54 having the same concentric circle center C. The plurality of circular steps 51, 52, 53, and 54 of each of the compensation tubes 551, 552, and 553 are formed at an external circumferential surface of the compensation tubes 551, 552, and 553 in the outer direction with reference to the concentric circle center C.

The step width w2 of the plurality of circular steps 51, 52, 53, and 54 decreases toward the concentric circle center C.

By controlling the height h of the sub-viewing angle compensation member 550 and the step width w2 of the circular steps, optical characteristic changes such as the luminance change and the color change according to the viewing angle may be minimized or reduced. The height h of the sub-viewing angle compensation member 550 according to a wavelength λ of the passing light, a refractive index $n_1$ of the circular steps, the number m of the circular steps, and the number L of layers of the circular steps is defined by Equation 1 above.

For example, in the sub-viewing angle compensation member 550 shown in FIG. 13, the number m of the circular steps is 5, and the number L of layers of the circular steps is 4 in the center compensation tube 551. When the refractive index $n_2$ of air is 1 and the refractive index $n_1$ of the circular step is 1.54, the height h of the circular step for the green light of the wavelength 550 nm is about 7.13 μm. By controlling the number m of the circular steps according to the size of the pixel, the height of the sub-viewing angle compensation members 550 may be optimized.

A plurality of compensation tubes 551, 552, and 553 each including a plurality of circular steps 51, 52, 53, and 54 may be formed by photolithography using the half tone mask or the gray mask, or by LIGA. LIGA is a fine pattern process basically including X-ray lithography, fine electroplating, and fine molding.

As described above, a plurality of circular steps 51, 52, 53, and 54 having the same concentric circle center C and the viewing angle compensation layer 500b having a plurality of compensation tubes 551, 552, and 553 are formed on the thin film encapsulation layer 400 to align all light to be in parallel so the same images as seen at the front may be recognized at the side, thereby improving the viewing angle.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF REFERENCE NUMERALS OF
SOME PARTS OF THE EMBODIMENTS

| 190: pixel electrode | 270: common electrode |
|---|---|
| 320: organic emission layer | 400: thin film encapsulation layer |
| 500, 500a, 500b: viewing angle compensation layer | |
| 510: supporting layer | |
| 520, 540, 550: sub-viewing angle compensation member | |
| 530: external protective layer | |

What is claimed is:

1. An organic light emitting diode (OLED) display comprising:
 a substrate;
 an organic light emitting element on the substrate;
 a thin film encapsulation layer covering the organic light emitting element; and
 a viewing angle compensation layer on the thin film encapsulation layer,
 wherein the thin film encapsulation layer is between the organic light emitting element and the viewing angle compensation layer, and
 wherein the viewing angle compensation layer corresponding to a pixel of the organic light emitting element comprises a plurality of sub-viewing angle compensation members.

2. The organic light emitting diode (OLED) display of claim 1, wherein
 a planar shape of the sub-viewing angle compensation member has a plurality of concentric circular shapes.

3. The organic light emitting diode (OLED) display of claim 2, wherein
 one of the sub-viewing angle compensation members comprises a plurality of compensation tubes concentrically arranged to have a same concentric circle center and different radii.

4. The organic light emitting diode (OLED) display of claim 3, wherein
 neighboring ones of the compensation tubes are separated from each other.

5. The organic light emitting diode (OLED) display of claim 4, wherein
 among the plurality of compensation tubes, the width of the compensation tube decreases as the radius of the compensation tube increases.

6. The organic light emitting diode (OLED) display of claim 5, wherein
 the plurality of compensation tubes have a same height.

7. The organic light emitting diode (OLED) display of claim 5, wherein
 a separation distance of neighboring ones of the compensation tubes increases as the radii of the neighboring compensation tubes increase.

8. The organic light emitting diode (OLED) display of claim 4, wherein
 among the plurality of compensation tubes, the width of the compensation tube increases as the radius of the compensation tube increases.

9. The organic light emitting diode (OLED) display of claim 8, wherein
 an external circumferential surface of each of the compensation tubes has a plurality of circular steps.

10. The organic light emitting diode (OLED) display of claim 9, wherein
 a step width of the plurality of circular steps decreases toward the concentric circle center.

11. The organic light emitting diode (OLED) display of claim 2, wherein
 the sub-viewing angle compensation member comprises a plurality of circular steps concentrically arranged to have a same concentric circle center.

12. The organic light emitting diode (OLED) display of claim 11, wherein
 a step width of the plurality of circular steps decreases toward the concentric circle center.

13. The organic light emitting diode (OLED) display of claim 1, wherein the viewing angle compensation layer further comprises a protective layer and a supporting layer, the plurality of sub-viewing angle compensation members are between the protective layer and the supporting layer.

14. The organic light emitting diode (OLED) display of claim 11, wherein the plurality of circular steps comprise gray mask-formed circular steps, or half tone mask-formed circular steps.

15. The organic light emitting diode (OLED) display of claim 11, wherein a number of the plurality of circular steps corresponds to a size of the pixel.

* * * * *